(12) United States Patent
Berger et al.

(10) Patent No.: US 11,933,942 B2
(45) Date of Patent: Mar. 19, 2024

(54) NON-LINE-OF-SIGHT DEPOSITION OF COATING ON INTERNAL COMPONENTS OF ASSEMBLED DEVICE

(71) Applicant: APPLIED MATERIALS, INC., Santa Clara, CA (US)

(72) Inventors: Alexander Berger, Palo Alto, CA (US); Cheng-Hsuan Chou, Santa Clara, CA (US); David Knapp, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 16/820,338

(22) Filed: Mar. 16, 2020

(65) Prior Publication Data

US 2020/0310001 A1 Oct. 1, 2020

Related U.S. Application Data (60) Provisional application No. 62/823,540, filed on Mar. 25, 2019.

(51) Int. Cl.
*C23C 16/04* (2006.01)
*B05D 1/00* (2006.01)
(Continued)

(52) U.S. Cl.
CPC ............... *G02B 1/14* (2015.01); *B05D 1/60* (2013.01); *B05D 7/22* (2013.01); *C23C 16/045* (2013.01); *G02B 3/00* (2013.01)

(58) Field of Classification Search
CPC ... G02B 1/14; G02B 3/00; B05D 1/60; B05D 7/22; C23C 16/045
(Continued)

(56) References Cited

U.S. PATENT DOCUMENTS 6,324,428 B1 * 11/2001 Weinberg ............... H05K 3/284
607/36
8,697,458 B2 4/2014 Nolan et al.
(Continued)

FOREIGN PATENT DOCUMENTS

WO 97-15699 A2 5/1997

OTHER PUBLICATIONS

PCT International Search Report and Written Opinion for International Application No. PCT/US2020/023450 dated Jul. 8, 2020, 12 pages.

*Primary Examiner* — Ruiyun Zhang
(74) *Attorney, Agent, or Firm* — Lowenstein Sandler LLP (57) ABSTRACT

Described herein is a method of depositing a conformal, optically transparent coating onto a surface of one or more internal components that are enclosed within an assembled device using a non-line-of-sight deposition process without altering a structure of the assembled device or impacting functionality of the assembled device. Also described is an assembled device including one or more internal components enclosed within the assembled device and a coating deposited onto a surface of the internal components enclosed within the assembled device, where the coating is a conformal, optically transparent coating that is resistant to corrosion by at least one of fluorine-, chlorine-, sulfur-, hydrogen-, bromine-, or nitrogen-based acids and that does not negatively impact functionality of the internal components.

9 Claims, 5 Drawing Sheets

(51) Int. Cl.
  *B05D 7/22* (2006.01)
  *G02B 1/14* (2015.01)
  *G02B 3/00* (2006.01)

(58) Field of Classification Search
  USPC .......................................... 428/409; 427/58
  See application file for complete search history.

(56) References Cited

U.S. PATENT DOCUMENTS

| | | |
|---|---|---|
| 8,911,060 B2 | 12/2014 | Drury |
| 9,596,794 B2 | 3/2017 | Stevens et al. |
| 10,190,701 B2 | 1/2019 | Raj et al. |
| 2013/0335898 A1* | 12/2013 | Stevens .................... H05K 5/00 |
| | | 361/679.01 |

* cited by examiner

NON-LINE-OF-SIGHT DEPOSITION OF COATING ON INTERNAL COMPONENTS OF ASSEMBLED DEVICE

RELATED APPLICATIONS

This application claims the benefit under 35 U.S.C. § 119(e) of U.S. Provisional Patent Application No. 62/823,540, filed Mar. 25, 2019, which is incorporated herein, in its entirety, by this reference.

TECHNICAL FIELD

Embodiments of the present disclosure relate to methods of coating a surface of one or more internal components enclosed within an interior of an assembled device with a conformal, optically transparent coating, as well as to assembled devices having such a coating.

BACKGROUND

Various manufacturing processes expose assembled devices to high temperatures, a mixture of corrosive gases, high stress, and combinations thereof. For example, an assembled device may be exposed to an environment containing fluorine-, chlorine-, sulfur-, hydrogen-, bromine-, or nitrogen-based gases. Such gases may penetrate such an assembled device and condense on surfaces of internal components of the assembled device as acids. The acids may erode and/or corrode the internal and external components of assembled devices, increasing the devices' susceptibility to defects.

An assembled device may include one or more internal components which are enclosed within an interior of the assembled device. The manufacturing process of the assembled device may make it difficult to individually protect each internal component enclosed within the assembled device from exposure to the corrosive conditions described above. Additionally, given a wide range of use applications for an assembled device, it may be difficult for a manufacturer to predict the type of environment each assembled device may be exposed to and individually protect each internal component in accordance with that environment's conditions prior to assembling the assembled device. Furthermore, disassembly of assembled devices in order to add protection to internal components may be impracticable, as such disassembly may interfere with earlier calibration of the assembled devices.

In some applications, a position encoder may be utilized in a robotic system to measure a position of one or more robotic arms within the system. Various components of the robotic system may be exposed to an environment containing fluorine-, chlorine-, sulfur-, hydrogen-, bromine-, or nitrogen-based gases. Given the erosive and/or corrosive nature of these gases, a position encoder may be specially selected that is resistant to this environment, including a magnetic encoder, a stainless steel encapsulated inductive encoder, or an aluminum encapsulated inductive encoder. However, a magnetic encoder has a lower sensitivity compared to other types of encoders and therefore may not provide enough movement accuracy and/or placement accuracy or enough resolution of each axis of motion of the robotic arms. Further, stainless steel and aluminum encapsulated inductive encoders may occupy a large amount of space within the robotic system and may have a lower resolution compared to other types of encoders, resulting in lower robot accuracy.

SUMMARY

Some of the embodiments described herein cover a method of loading an assembled device into a deposition chamber, wherein the assembled device includes one or more internal components that are enclosed within an interior of the assembled device, and depositing a coating onto a surface of the internal components using a non-line-of-sight deposition process without altering a structure of the assembled device or impacting functionality of the assembled device. The coating may be a conformal, optically transparent coating. Depositing the coating onto the surface of the internal components may include injecting a precursor for the coating into the deposition chamber, where the precursor penetrates an exterior of the assembled device through one or more openings of the assembled device that expose the interior of the assembled device to an external environment.

In some embodiments, an assembled device includes one or more internal components enclosed within the assembled device. A coating may be deposited onto a surface of the internal components enclosed within the assembled device, where the coating is a conformal, optically transparent coating that is resistant to corrosion by at least one of fluorine-based acids, chlorine-based acids, sulfur-based acids, hydrogen-based acids, bromine-based acids, or nitrogen-based acids that does not negatively impact a functionality of the internal components.

In some embodiments, an assembled device includes one or more internal components enclosed within the assembled device. A coating may be deposited onto a surface of the internal components enclosed within the assembled device, where the coating is a conformal, optically transparent coating. The assembled device may be manufactured by a process comprising providing the assembled device, loading the assembled device into a deposition chamber, and depositing the coating onto the surface of the internal components using a non-line-of-sight deposition process without altering a structure or impacting functionality of the assembled device, where depositing the coating onto the surface of the internal components includes injecting a precursor for the coating into the deposition chamber, where the precursor penetrates an interior of the assembled device through one or more openings of the assembled device that expose the interior of the assembled device to an external environment.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein related to articles and methods where a conformal, optically transparent coating is deposited onto a surface of one or more internal components enclosed within an interior of an assembled device without altering the structure, or impacting the functionality, of the assembled device. The assembled device may include one or more optical components. The one or more optical components may include an optical window, an optical lens or a laser head, for example. The one or more optical components may be included based on the functionality of the assembled device. For example, an assembled device, such as an optical encoder, may include an internal optical component and an optical window built into a wall of the assembled device. The internal optical component and the optical window may be configured so as to allow the optical component to emit light that exits the assembled device through the optical window, and to allow light to enter the assembled device, through the optical. The coating may be provided to protect the internal components from a corrosive environment where the assembled device may be exposed to fluorine-, chlorine-, sulfur-, hydrogen-, bromine-, or nitrogen-based acids. For example, the assembled device may be exposed to HF, HCl, $H_2SO_4$, etc. The coating may be provided to reduce defects that result from exposure to extreme conditions and improve the erosion and corrosion resistance of the assembled device. In one embodiment, the coating may have a porosity of between approximately 0.1% and 1.0%. In another embodiment, the coating may be a pinhole free coating (e.g., a coating that does not contain any pinholes and/or has a porosity of approximately 0%). The coating may further be an optically transparent coating. In some embodiments, the coating may be any conformal, inert coating that may be formed on a surface of the internal components and that provides protection from a corrosive environment. In one embodiment, the coating may be any conformal, optically transparent coating that has an index of refraction of between about 1.57 to about 1.67. The coating may be deposited using a non-line of sight technique such as atomic layer deposition (ALD), chemical vapor deposition (CVD), or plasma enhanced CVD (PECVD)

The coating may coat the entire interior of the assembled device, including the surface of one or more internal components. In some embodiments, the conformal, optically transparent coating may have a uniform thickness of between about 0.1 microns to about 20 microns, or about 3 microns to about 6 microns, or about 4 microns to about 5 microns, or about 7 microns to about 15 microns, or about 15 microns to about 20 microns. It is advantageous to protect the internal components of assembled devices by coating such internal components without interfering with a functionality of those internal components and without disassembling the assembled devices. Such coating of internal components of assembled devices may be performed after assembly has been completed in accordance with a particular application for which the assembled devices will be used and/or a particular environment to which the assembled devices will be exposed. For example, particular coating materials may be selected based on a target use of the assembled device. Such coating materials may be inert materials that are resistant to erosion by halogens and/or acids. Such coating materials may be transparent to light having particular wavelength ranges (e.g., to light in the optical wavelengths) in some embodiments. Given the complexity and precision involved in assembling many types of assembled devices, it is further advantageous to protect the internal components without altering the structure, or impacting the functionality, of the assembled device.

For some applications, the internal components of an assembled device may include one or more optical components, which are included for the functionality of the assembled device. For example, an assembled device, such as an optical encoder, may include an internal optical lens and an optical window built into a wall of the assembled device. The internal optical lens and the optical window may be configured so as to allow light to be transmitted from the optical lens through the optical window to the exterior of the assembled device, and to allow light to be transmitted from the exterior of the assembled device back through the optical window to the optical lens. In applications in which this assembled device is utilized, it is advantageous to provide a method of protection that maintains the optical transparency of the optical components, while sufficiently protecting the optical, and non-optical, components from a corrosive operating environment.

In some embodiments, the coating on internal components of an assembled device may be a chemical vapor deposited poly(p-xylylene) polymer (often referred to as Parylene) coating. The coating may include a Parylene C ($C_{16}H_{14}C_{12}$), Parylene D ($C_{16}H_{12}C_{14}$), Parylene N ($C_{16}H_{16}$), or any other conformal, optically transparent Parylene coating. In such embodiments, the Parylene coating may be deposited onto the surface of the one or more internal components of the assembled device by performing a chemical vapor deposition process of a poly(p-xylylene) polymer (often referred to as a Parylene deposition process). The Parylene deposition process may be a vapor deposition polymerization process where the assembled device is loaded into a deposition chamber, a vacuum is applied to the deposition chamber, a Parylene precursor is injected into the deposition chamber and covers the surface of the one or more internal components, and a Parylene coating is deposited onto the surface of the one or more internal components, as well as the entire interior of the assembled device.

In some embodiments, the coating may be a Parylene C coating. The Parylene C coating may be deposited onto the surface of the one or more internal components of the assembled device by performing a Parylene deposition process, as described herein above. In some embodiments, the Parylene C coating may have a thickness of between about 0.1 microns to about 20 microns, or about 7 microns to about 15 microns, or about 4 microns to about 5 microns. In one embodiment, the Parylene C coating may have an index of refraction of about 1.59.

In some embodiments, the coating on internal components of an assembled device may be a rare earth oxide coating, which may comprise $Y_2O_3$, $Y_3Al_5O_{12}$ (YAG), $Er_2O_3$, $Er_3Al_5O_{12}$ (EAG), yttria-stabilized zirconia (YSZ), a solid solution of $Y_2O_3$—$ZrO_2$, a composition comprising $Y_4Al_2O_9$ and a $Y_2O_3$—$ZrO_2$ solid solution, and/or another rare earth oxide. In other embodiments, the coating on internal components of the assembled device may be a metal oxide coating, which may comprise $Al_2O_3$ (alumina), $SiO_2$, and other metal oxide coatings. Such rare earth oxide and metal oxide coatings may be deposited using ALD deposition techniques and/or chemical vapor deposition (CVD) deposition techniques.

In some embodiments, the coating on the surface of the internal components of the assembled device may be a superhydrophobic ceramic coating, such as Repellix™. In other embodiments, the coating may be a fluoropolymer coating, such as Novec™.

According to embodiments described herein, the exterior of the assembled device may be optionally cleaned prior to the deposition of the coating. In some embodiments, the exterior of the assembled device may be wiped with a cloth containing water or isopropyl alcohol (IPA). In other embodiments, the exterior of the assembled device may be cleaned with a water or IPA rinse. The assembled device may not be cleaned by submerging the assembled device in a cleaning solution or in water in some embodiments.

According to embodiments described herein, at least one portion of the assembled device may be optionally masked prior to depositing the coating to prevent the coating from being deposited on that portion. For example, an assembled device may include an optical window built into a wall of the assembled device. The optical window may be masked with a mask prior to depositing the coating so that the coating is not deposited onto the optical window. In some embodiments, the exterior of the assembled device may be cleaned in accordance with embodiments previously described prior to the application of the mask.

In some embodiments, a position encoder may be utilized in a robotic system to measure a position of one or more robotic arms within the system. Various components of the robotic system may be exposed to an environment containing fluorine-, chlorine-, sulfur-, hydrogen-, bromine-, or nitrogen-based gases. Such gases may penetrate the exterior of the position encoder and condense on surfaces of internal components of the position encoder as acids. Given the erosive and/or corrosive nature of these gases, a position encoder may be specially selected that is resistant to this environment, including a magnetic encoder, a stainless steel encapsulated inductive encoder, or an aluminum encapsulated inductive encoder. However, a magnetic encoder and a stainless steel or aluminum encapsulated inductive encoder may not provide sufficient resolution of each axis of motion of the robotic arms, as would other types of encoders, such as an optical encoder. For example, an optical encoder may allow a 26-bit resolution, while a magnetic encoder may only allow a maximum resolution of 19-20 bit. An optical encoder may provide a higher bit resolution, and may reduce and/or eliminate the risk of losing an absolute position of the robotic arms, as compared with the use of a magnetic encoder. An optical encoder may also provide higher sensitivity than a magnetic encoder, so as to provide higher movement and/or placement accuracy. In another example, an optical encoder may be smaller than an inductive encoder, thus occupying a smaller amount of space within the robotic system. As such, it is advantageous to utilize an optical encoder within the robotic system so as to provide a higher bit resolution, higher sensitivity, and occupy a smaller amount of space within the robotic system.

Although it may be advantageous to utilize an optical encoder within a robotic system over other types of encoders, the erosive and/or corrosive nature of an environment containing fluorine-, chlorine-, sulfur-, hydrogen-, bromine-, or nitrogen-based gases may erode and/or corrode the internal components enclosed within an interior of the optical encoder, as well as the exterior of the optical encoder. As such, it may be advantageous to coat the surfaces of the internal components of the optical encoder to protect the optical encoder against erosion and/or corrosion, extending the life of the optical encoder, as set forth in embodiments herein. It may further be advantageous to coat the surfaces of the internal components without interfering with a functionality of the internal components and without disassembling the optical encoder, as also set forth in embodiments herein.

Embodiments are discussed with regards to coating internal components of specific assembled devices, such as optical encoders. However, it should be understood that embodiments described herein also apply to other assembled devices that may be exposed to harsh chemical environments. Examples of other assembled devices that may be coated as discussed herein include cameras, image sensors, lasers, etc.

Figure 1:
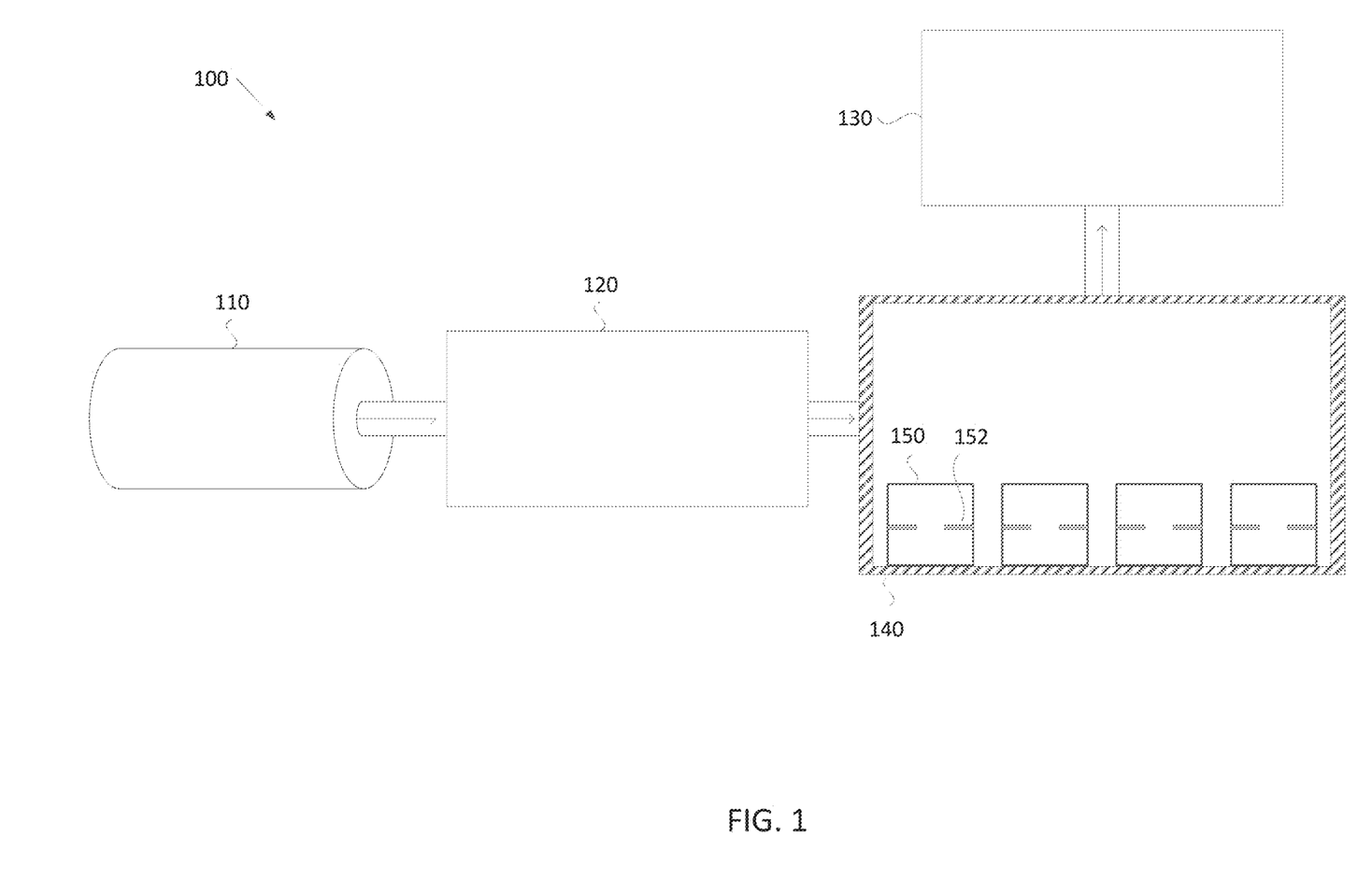
FIG. 1 depicts a sectional view of a deposition system, in accordance with embodiments of the present disclosure.

FIG. 1 depicts a sectional view of a deposition system 100 for depositing a conformal, optically transparent, inert coating onto a surface of one or more internal components enclosed within an interior of an assembled device 150, in accordance with embodiments of the present disclosure. Deposition system 100 may include a chamber for performing a non-line-of-sight deposition process, such as a Parylene deposition process, an ALD deposition process, a CVD deposition process, and so on.

In some embodiments, deposition system 100 may be a Parylene deposition system and the conformal, optically transparent coating deposited onto the internal components of an assembled device 150 may be a Parylene coating. The Parylene deposition system may include a vaporization chamber 110 (also referred to as a vaporizer). A powdered Parylene dimer (e.g., a [2,2] paracyclophane dimer) may be provided into vaporization chamber 110 as a precursor to the Parylene coating. The Parylene dimer may be vaporized into a dimeric Parylene gas. In one embodiment, vaporization chamber 110 may be maintained at a temperature between about 80° C. to about 150° C. and a pressure of about 1.0 torr in embodiments.

The Parylene deposition system may further include a pyrolysis furnace 120. The dimeric Parylene gas may be provided from vaporization chamber 110 to pyrolysis furnace 120. The dimeric Parylene gas may be pyrolized into a monomeric Parylene gas. During pyrolization, the dimeric Parylene gas may be cleaved at two methylene-methylene bonds to yield monomeric Parylene. Pyrolysis furnace 120 may be maintained at a temperature of between about 650° C. to about 680° C. and a pressure of about 0.5 torr in embodiments.

The Parylene deposition system 100 may further include a deposition chamber 140. The monomeric Parylene gas may be provided from pyrolysis furnace 120 to deposition chamber 140. A vacuum may be applied to deposition chamber 140 prior to the monomeric Parylene gas entering deposition chamber 140. The vacuum may be provided to deposition chamber 140 by vacuum pump 130. The vacuum may be applied at about 0.1 torr in an embodiment, and the vacuum may be applied for a time period in a range from about 5 minutes to about 60 minutes in embodiments.

Deposition chamber 140 may contain one or more assembled devices 150 during the Parylene deposition process. In one embodiment, deposition chamber 140 may hold multiple assembled devices 150 that are processed simultaneously (e.g., during a batch process). An assembled device 150 may include one or more internal components which are enclosed within the interior of assembled device 150. Assembled device 150 may further include one or more openings 152 which expose the interior of assembled device 150 to the environment of deposition chamber 140. An example of an assembled device 150 is an optical encoder (e.g., a device used to determine the position of an object by translating an optically determined linear or rotary position of the object to a digital output). In one embodiment, assembled device 150 may include an opening with a diameter of approximately 0.1-0.5 inches (e.g., 3 millimeters) within one or more wall of assembled device 150.

The Parylene coating may be deposited on the surface of one or more internal components of assembled device 150 in deposition chamber 140. The monomeric Parylene gas may enter the interior of assembled device 150 through the one or more openings 152. The monomeric Parylene gas present in the interior of assembled device 150 may adsorb and polymerize on all interior surfaces within assembled device 150, coating all internal components. The monomeric Parylene gas may further adsorb and polymerize on all exterior surfaces of assembled device 150. The coating formed on the interior surfaces of the assembled device 150 (and on the exterior surfaces of the assembled device 150) may be an inert, optically transparent coating. In one embodiment, the coating is a Parylene C coating. The coating may be resistant to erosion from halogen-based chemistries and other corrosive chemistries in embodiments, such as fluorine-based acids, chlorine-based acids, sulfur-based acids, hydrogen-based acids, bromine-based acids, or nitrogen-based acids. In some embodiments, the coating is a conformal coating having an approximately uniform thickness of between about 0.1 microns and about 20 microns. In some embodiments, the coating has a thickness of about 4-5 microns.

In some embodiments, the assembled device includes one or more internal optical components (e.g., such as an optical lens, an optical window, a laser head, etc.). In such embodiments, the coating should be transparent or nearly transparent at the wavelengths of light that are used by the internal optical components. Additionally, a coating that is too thick may interfere with the functionality of the optical components, while a coating that is too thin may be insufficiently resistant to erosion. In some embodiments, the assembled device is an optical encoder, and the coating is Parylene C and has a thickness of about 4-5 microns. It was discovered that a Parylene C coating having a thickness of about 4-5 microns does not to interfere with a functionality of the internal optical components of an optical encoder and at the same time provides protection from erosion caused by acids such as fluorine-based acids, chlorine-based acids, sulfur-based acids, hydrogen-based acids, bromine-based acids, and nitrogen-based acids over a lifespan of the optical encoder.

Figure 2A:
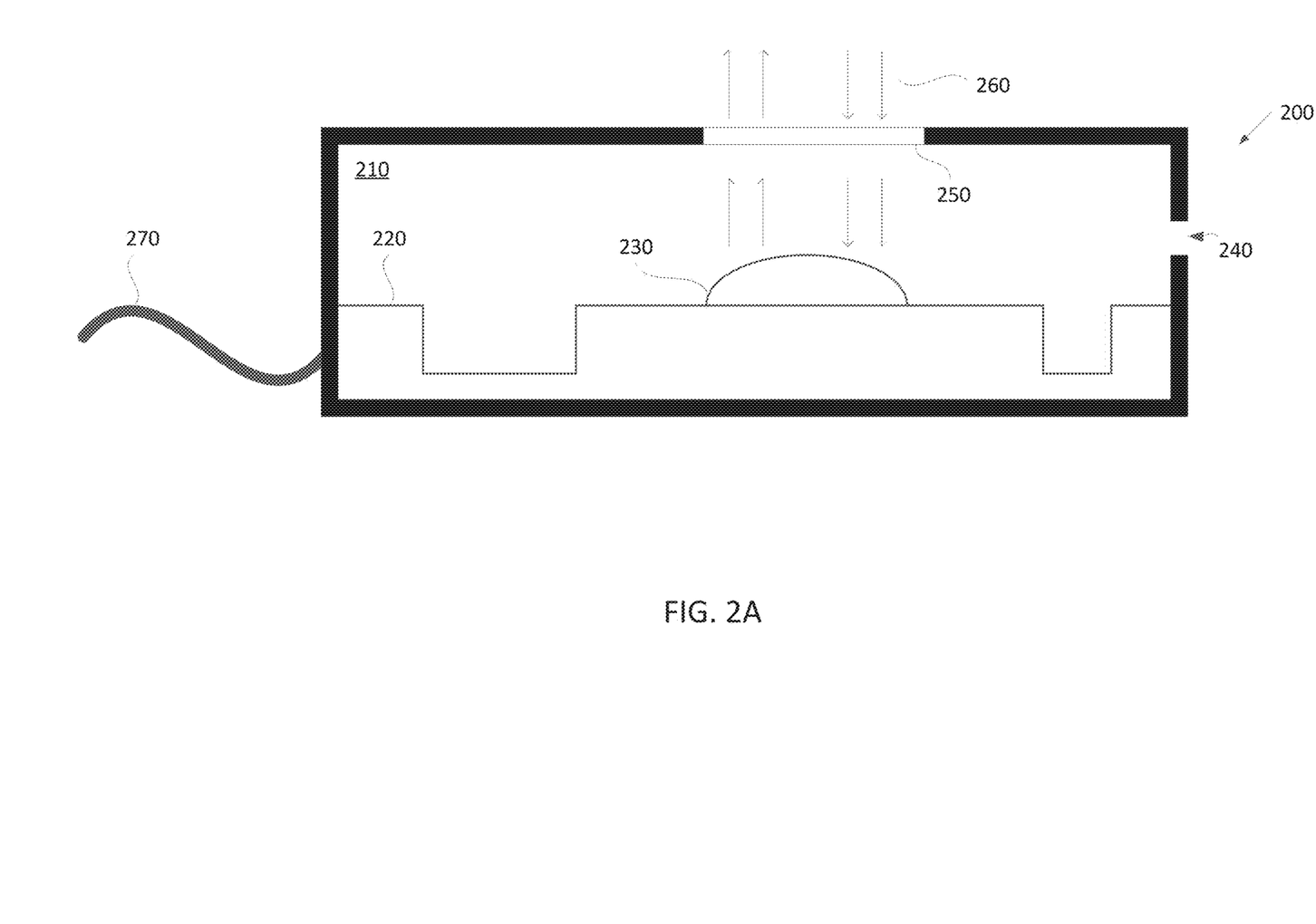
FIG. 2A depicts a sectional view of an assembled device including internal components enclosed within an interior of the assembled device.

FIG. 2A depicts a sectional view of an assembled device 200 including one or more internal components 220, 230 enclosed within an interior 210 of assembled device 200. In one embodiment, the one or more internal components 220 may include a plurality of surfaces defined within assembled device 200. In one embodiment, internal components 220 may include at least one optical component 230. Optical components 230 may include an optical lens, a light source such as a laser and/or one or more light emitting diodes (LED), one or more optical sensors (e.g., photodiodes, complimentary metal-oxide-semiconductor (CMOS) sensors, charge-coupled device (CCD) sensors, etc.), and so on. Internal components 220 may further include non-optical components, such as electrical connections, switches, computing components, integrated circuits, printed circuit boards, semiconductor devices, mechanical components, etc.

Assembled device 200 may further include an optical window 250 in a wall of assembled device 200. Optical window 250 and optical component 230 may be configured so as to allow optical component 230 to emit light 260 that exits assembled device 200 through optical window 250. In another embodiment, optical component 230 may receive light 260 that enters assembled device through optical window 250. The light may be light that was emitted by the optical component 230 and reflected off of surfaces external to the assembled device 200.

In one embodiment, assembled device 200 may comprise an optical encoder. Examples of optical encoders include optical rotary encoders (also called optical shaft encoders) and optical linear encoders. An optical rotary encoder is an electromechanical device that converts the angular position and/or motion of a shaft or axle to an analog or digital code. The optical rotary encoder may be an absolute or incremental encoder.

In one embodiment, the assembled device 200 is an optical encoder, and the internal components 220 include a light source (e.g., an LED light) and a sensor (e.g., a photodiode), where the light source and/or sensor may correspond to optical component 230. The optical encoder may further include a moveable disk and a fixed mask.

The light source shines through one side of the optical shaft encoder. The encoder wheel or disk has a series of tracks on it. The mask may have a corresponding track for every track on the disk of the optical encoder, and small perforations, called windows, may be cut along the tracks in the mask. As the disk moves, different windows in the mask are covered or open, showing the movement and position of the optical encoder. Each arc in the rotation indicates a different position and has a different pattern of open and closed windows. The sensor behind the mask identifies the optical encoders' current pattern. In one embodiment, the sensor is on an opposite side of the disk and mask from the light source. Alternatively, the light source may shine the light through the disk and mask, the light may be reflected off of a reflector and back through the disk and/or mask, and the light may be received by the optical sensor.

Each optical sensor may represent one signal for the optical encoder. An optical encoder can include multiple (e.g., two) sensors, which may be offset to provide two slightly different signals produced at the same time. These offset signals can be used by the optical encoder engine to determine more detailed motion information, such as speed. In one embodiment, the optical encoder is a phased-array optical rotary encoder.

Assembled device 200 may further include an opening 240 that exposes the interior 210 of assembled device 200 to an external environment, such as the environment of deposition chamber 140, as depicted in FIG. 1. In one embodiment, opening 240 may be included in a wall of assembled device 200, as illustrated in FIG. 2A. For example, assembled device 200 may include an opening 240 with a diameter of approximately 3 millimeters (0.125 inch) within one or more wall of assembled device 200. In another embodiment, one or more openings may form around external components of assembled device 200. For example, one or more openings may form around optical window 250 so as to prevent assembled device 200 from being completely sealed from the external environment.

Assembled device 200 may further include an electrical connector 270. Electrical connector 270 may be connected to one or more internal components 220 of assembled device 200 through one or more electrical pins and/or other electrical connections (not shown).

Figure 2B:
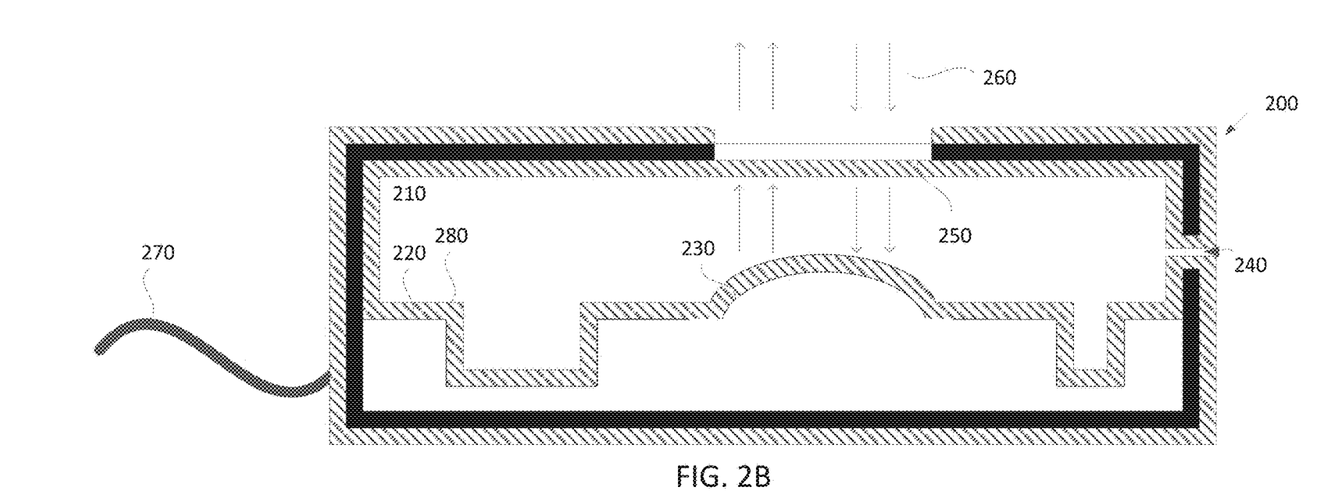
FIG. 2B depicts a sectional view of an assembled device, where one or more internal components enclosed within the interior have been coated by a conformal, optically transparent coating, in accordance with embodiments of the present disclosure.
Figure 2C:
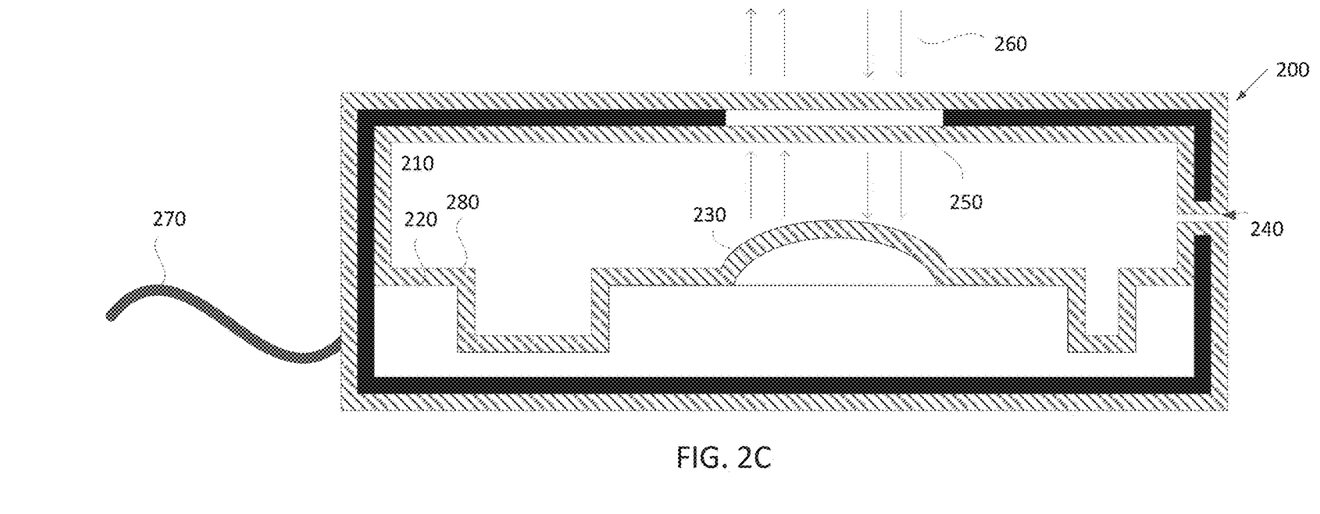
FIG. 2C depicts another sectional view of an assembled device, where one or more internal components enclosed within the interior have been coated by a conformal, optically transparent coating, in accordance with other embodiments of the present disclosure.

FIGS. 2B and 2C depict sectional views of assembled device 200 where internal components 220 enclosed within interior 210 have been coated with a conformal, optically transparent, inert coating 280 without altering the structure, or impacting the functionality, of assembled device 200, in accordance with embodiments of the present disclosure. Coating 280 may be applied in a deposition chamber, such as deposition chamber 140 as illustrated in FIG. 1. In some embodiments, coating 280 may be a rare earth oxide coating, which may comprise $Y_2O_3$, $Y_3Al_5O_{12}$ (YAG), $Er_2O_3$, $Er_3Al_5O_{12}$ (EAG), yttria-stabilized zirconia (YSZ), a solid solution of $Y_2O_3$—$ZrO_2$, or a composition comprising Y4Al2O9 and a $Y_2O_3$—$ZrO_2$ solid solution, and/or another rare earth oxide. In other embodiments, coating 280 may be a metal oxide coating, which may comprise $Al_2O_3$ (alumina), $SiO_2$, and/or other metal oxide coatings. Coating 280 may further be a superhydrophobic ceramic coating, such as Repellix™ or a fluoropolymer coating, such as Novec™. In other embodiments, coating 280 may be a Parylene coating. In one embodiment, the coating may have a porosity of between approximately 0.1% and 1.0%. In another embodiment, the coating may be a pinhole free coating (e.g., a porosity of approximately 0%). In other embodiments, coating 280 may be any conformal, optically transparent coating that has an index of refraction of between about 1.57 to 1.67 and is resistant to fluorine-, chlorine-, sulfur-, hydrogen-based acids, bromine-based acids, or nitrogen-based acids. In such embodiments, coating 280 may be deposited using a non-line-of-sight deposition technique such as a Parylene deposition process, an ALD deposition process, a CVD deposition process, and so on. Coating 280 may be deposited onto the entire interior 210 of assembled device 200. Coating 280 may have a uniform thickness of between about 0.1 microns to about 20 microns, or about 3 microns to about 6 microns, or about 4 microns to about 5 microns, or about 7 microns to about 15 microns, or about 15 microns to about 20 microns.

In some embodiments, coating 280 may be a Parylene (also referred to as para-xylylene) coating. Coating 280 may include at least one of a Parylene C ($C_{16}H_{14}C_{12}$), Parylene D ($C_{16}H_{12}C_{14}$), Parylene N ($C_{16}H_{16}$), or any other conformal, optically transparent Parylene coating. In such an embodiment, coating 280 may be deposited onto the surface of the internal components of assembled device 200 by performing a Parylene deposition process.

In one embodiment, coating 280 may be a Parylene C coating having a thickness of about 4-5 microns. The Parylene C coating may have an index of refraction of about 1.59. In such an embodiment, the Parylene coating may provide assembled device 200 protection from erosion and/or corrosion caused by acids such as fluorine-based acids, chlorine-based acids, sulfur-based acids, hydrogen-based acids, bromine-based acids, and nitrogen-based acids over a lifespan of assembled device 200.

A precursor such as a monomeric Parylene gas, a rare earth oxide precursor, an oxygen containing reactant, etc. may enter the interior of assembled device 200 through one or more openings of assembled device 200. For example, a Parylene gas may enter through opening 240 included in a wall of assembled device 200. In another example, the Parylene gas may enter through an opening formed around an external component of assembled device 200, such as optical window 250. A vacuum may be applied to the deposition chamber prior to the precursor being introduced to assembled device 200. A monomeric Parylene gas may simultaneously adsorb and polymerize on all surfaces in which it has contact. For example, the monomeric Parylene gas present in the interior 210 of assembled device 200 may adsorb and polymerize on all interior surfaces within assembled device 200, coating all internal components 220. Alternatively, an ALD precursor may adsorb onto a surface of the internal components 220, 230 to form an adsorption layer thereon, and an oxygen containing reactant may then react with the adsorption layer to form a rare earth oxide coating.

In one embodiment, the exterior of assembled device 200 may be optionally cleaned prior to the deposition of coating 280. Electrical connector 270 may also be cleaned. In one embodiment, the exterior of assembled device 200 and/or electrical connector 270 may be wiped with a cloth containing isopropyl alcohol (IPA) or water. In another embodiment, the exterior of assembled device 200 and/or electrical connector 270 may be cleaned with an IPA or water rinse. Assembled device 200 may not be cleaned by submerging the device in a cleaning solution or water, in some embodiments.

In another embodiment, a portion of assembled device 200 may be optionally masked prior to the deposition of coating 280. In one embodiment, a soft mask may be used to cover portions of assembled device 200 that are not to be coated. The soft mask may be, for example, a tape, such as a polyimide tape (e.g., a Kapton® tape), that is placed over the portions that will not be coated. In one embodiment, optical window 250 may be composed of a material that is resistant to corrosive gases in high stress environments (e.g., quartz, glass, etc.). In such and embodiment, the exterior of optical window 250 may be masked so as to prevent coating 280 from being deposited on the exterior of optical window 250. As a result, coating 280 may not be deposited on the exterior surface of optical window 250, as illustrated in FIG. 2B. In another embodiment, the exterior of optical window 250 may not be masked. As a result, coating 280 may be deposited on the exterior surface of optical window 250, as illustrated in FIG. 2C. In other embodiments, the mask may be applied to electrical connector 270 so as to prevent coating 280 from being deposited on electrical connector 270. Electrical connector 270 may include one or more pins for making electrical connections. In such an embodiment, the one or more pins may be masked prior to the deposition of coating 280 so as to prevent coating 280 from being deposited on the one or more pins. In some embodiments, the portion of assembled device 200 to be masked may be cleaned in accordance with embodiments previously described prior to the mask being applied.

Figure 3:
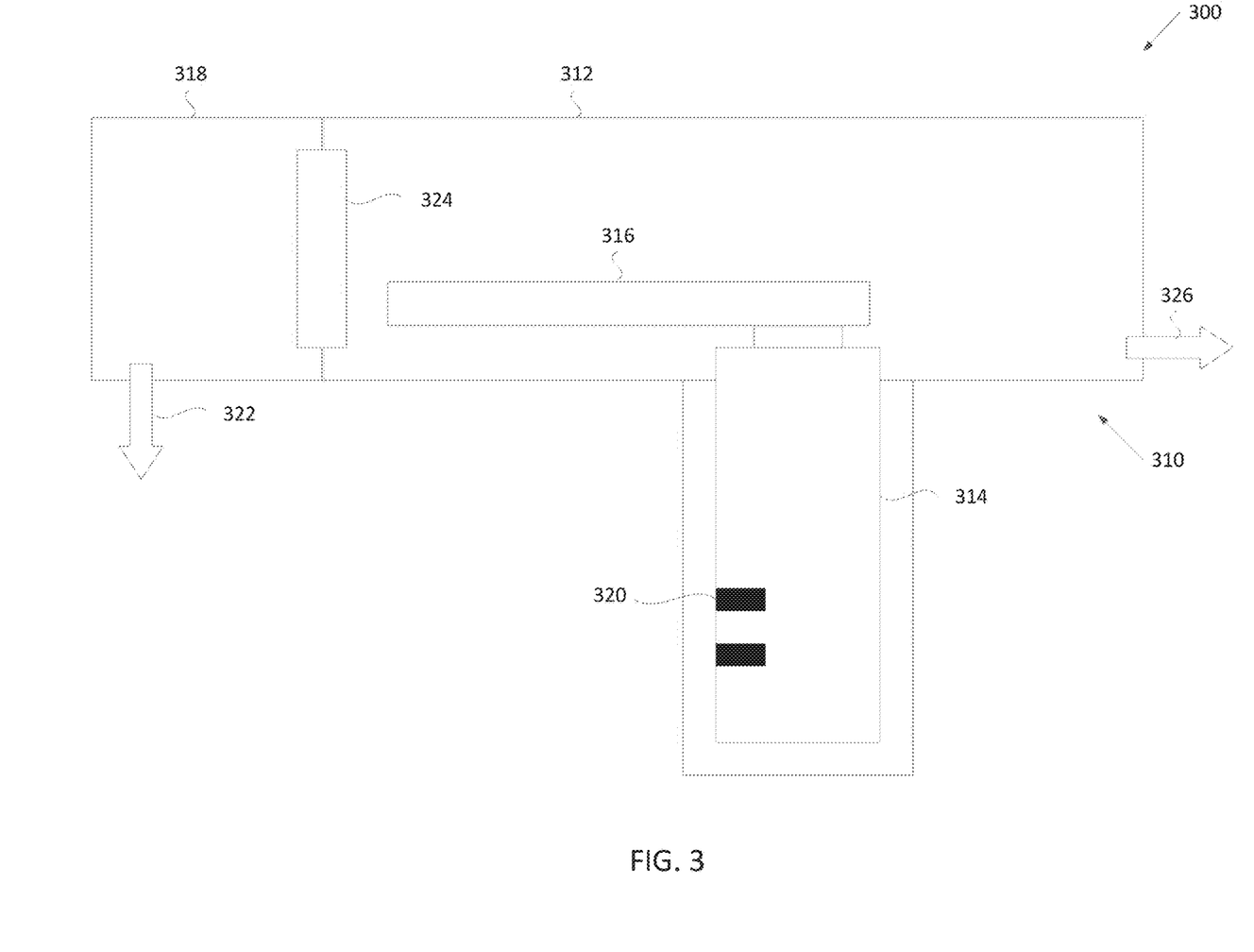
FIG. 3 illustrates a schematic diagram of an example embodiment of an electronic device processing system including optical encoders according to one or more embodiments of the present disclosure.

FIG. 3 illustrates a schematic diagram of an example embodiment of an electronic device processing system 300 including optical encoders according to one or more embodiments of the present disclosure. The electronic device processing system 300 may include a housing 310 having walls defining a transfer chamber 312. The walls may include side walls, a floor, and a ceiling, for example. A robot 314 may be at least partially housed within transfer chamber 312. Robot 314 may be configured and adapted to place or extract substrates to and from various destinations via operation of moveable arms 316 of robot 314. "Substrates" may include articles used to make electronic devices or electrical circuit components, such as silicon-containing wafers or articles, patterned or masked silicon wafers or articles, displays, or the like.

Robot 314 may be any suitable type of robot adapted to service the various chambers that are coupled to, and accessible from, transfer chamber 312. Robot 314 may be a selective compliance assembly robot arm (SCARA) robot, or any other suitable robot type.

The motion of the various arms of robot 314 may be controlled by suitable commands to a drive assembly (not shown) containing a plurality of drive motors from a robot controller (not shown). Signals from the robot controller may cause motion of the various components of the robot 314 to cause movement of substrates between one or more process chambers 318. Suitable feedback mechanisms may be provided for one or more of the components by various sensors, such as position encoders 320. Position encoders 320 may measure an angle of rotation and/or an angle of axis of robot 314 and provide feedback to the robot controller indicating where moveable arms 316 of robot 314 are. Position encoders 320 may include one or more internal components enclosed within position encoders 320. The internal components of position encoders 320 may be coated with a conformal, optically transparent coating, in accordance with embodiments of the present disclosure.

In one embodiment, position encoders 320 may be optical encoders. Position encoders 320 may allow up to a 26 bit resolution, thus providing a high movement and/or position accuracy for moveable arms 316 of robot 314. Position encoders 320 may have been coated with an inert coating that is resistant to erosion, where the coating may uniformly coat internal components of position encoders 320, as described herein above. Position encoders 320 may have been coated with a Parylene coating. In some embodiments, position encoders may have been coated with a Parylene C coating having a thickness of about 4-5 microns. The Parylene C coating may make position encoders 320 resistant to erosion and/or corrosion caused by acids such as fluorine-based acids, chlorine-based acids, sulfur-based acids, hydrogen-based acids, bromine-based acids, and nitrogen-based acids.

Robot 314 may include a base that is adapted to be attached to a wall (e.g., a floor or ceiling) of housing 310. Moveable arms 316 of robot 314 may be adapted to be moveable in an X-Y plane relative to housing 310. Any suitable number of moveable arms 316 and end effectors (sometimes referred to as "blades") adapted to carry the substrates may be used.

Additionally, the drive assembly of robot 314 may include Z-axis motion capability in some embodiments. In particular, vertical motion of moveable arms 316 along the vertical direction may be provided so as to place and pick substrates to and from one or more process chambers 318 and one or more load lock chambers (not shown).

Transfer chamber 312 may have one or more process chambers 318 coupled to and accessible therefrom, at least some of which are adapted to carry out high-temperature processing on the substrates inserted therein. Process chambers 318 may be coupled to facets of housing 310 and each process chamber 318 may be configured and operable to carry out a suitable process (e.g., a plasma enhanced chemical vapor deposition (PECVD) process or etch process) on the substrates. A suitable process on the substrates carried out in process chambers 318 may include fluorine-, chlorine-, sulfur-, hydrogen-, bromine-, or nitrogen-based gases. Such gases may exit process chambers 318 through exhaust 322 or gate 324.

Gases that exit process chambers 318 through gate 324 may enter transfer chamber 312 and may come in contact with robot 314 and the components of robot 314 (including arms 316 and/or position encoders 320). Position encoders 320, including the internal components of position encoders 320, may be exposed to fluorine-, chlorine-, sulfur-, hydrogen-, bromine-, and/or nitrogen-based gases. Such gases may penetrate position encoders 320 and condense on the surfaces of the internal components of position encoders 320 as acids. If the internal components of position encoders 320 are not coated with a conformal, optically transparent coating, the acids may erode and/or corrode the internal components of position encoders 320. However, in embodiments the internal components of the position encoders 320 are coated with a conformal, inert coating (e.g., such as a Parylene coating or a rare earth oxide coating). The conformal, inert coating on the internal components may be protected from erosion and/or corrosion by the acids, decreasing the position encoders 320 susceptibility to defects.

Gases may exit transfer chamber 312 through exhaust 326.

Figure 4:
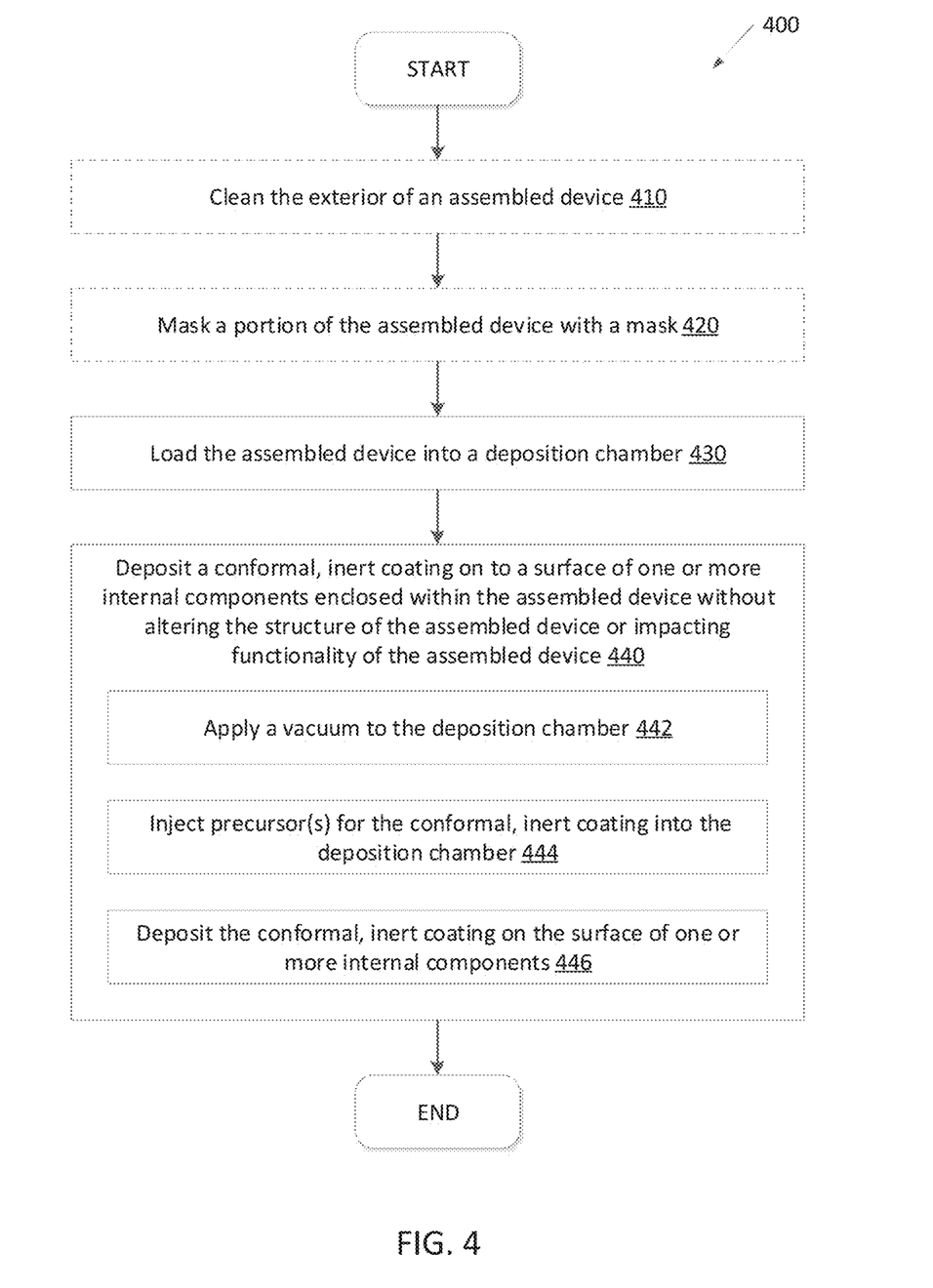
FIG. 4 illustrates a method for depositing a conformal, optically transparent coating onto a surface of one or more internal components enclosed within an interior of an assembled device, in accordance with embodiments of the present disclosure.

FIG. 4 illustrates a method 400 for depositing a conformal, inert coating onto a surface of one or more internal components enclosed within an interior of an assembled device, in accordance with embodiments of the present disclosure. In embodiments, the coating is an optically transparent coating. In other embodiments, the coating may be an optically opaque coating.

At block 410, the exterior of an assembled device may be optionally cleaned. An electrical connector attached to the exterior of the assembled device may also be cleaned. In one embodiment, the exterior of the assembled device and/or the electrical connector may be wiped with a cloth containing IPA or water. In another embodiment, the exterior of the assembled device and/or the electrical connector may be cleaned with an IPA or water rinse. The assembled device may not be cleaned by submerging the device in a cleaning solution or water, in some embodiments.

At block 420, a portion of the assembled device may be optionally masked prior to the deposition of the coating. In one embodiment, a soft mask may be used to cover portions of the assembled device that are not to be coated. The soft mask may be, for example, a tape, such as a polyimide tape (e.g., a Kapton® tape), that is placed over the portions of the assembled device that will not be coated. In one embodiment, an optical window in a wall of the assembled device may be composed of a material that is resistant to corrosive gases in high stress environments (e.g., quartz, glass, etc.). In such an embodiment, the exterior of an optical window may be masked to prevent the coating from being deposited on the exterior of the optical window. In another embodiment, the electrical connector attached to the exterior of the assembled device may be masked so to prevent the coating from being deposited on the electrical connector. The electrical connector may include one or more pins (e.g., electrical contacts) that may be masked prior to the deposition of the coating so to prevent coating from being deposited on the one or more pins.

At block 430, the assembled device may be loaded into a deposition chamber. The deposition chamber may correspond to the deposition chamber of deposition system 100 described with respect to FIG. 1. Alternatively, the deposition chamber may be an ALD or CVD deposition chamber. In some embodiments, several assembled devices may be loaded into the deposition chamber during the same processing cycle and may coated by the conformal, inert coating simultaneously (e.g., during a batch process).

At block 440, a conformal, inert coating may be deposited onto the surface of one or more internal components enclosed within the assembled device. The internal components may be coated without altering the structure of the assembled device or impacting functionality of the assembled device. In some embodiments, the coating may be deposited by a deposition process, such as the deposition process described in blocks 442-446.

The coating may be a rare earth oxide coating, which may comprise $Y_2O_3$, $Y_3Al_5O_{12}$ (YAG), $Er_2O_3$, $Er_3Al_5O_{12}$ (EAG), yttria-stabilized zirconia (YSZ), a solid solution of $Y_2O_3$—$ZrO_2$, or a composition comprising $Y_4Al_2O_9$ and a $Y_2O_3$—$ZrO_2$ solid solution, and/or another rare earth oxide. In other embodiments, the coating on internal components of the assembled device may be a metal oxide coating, which may comprise $Al_2O_3$ (alumina), $SiO_2$, and other metal oxide coatings. The coating may further be a superhydrophobic ceramic coating, such as Repellix™ or a fluoropolymer coating, such as Novec™. In other embodiments, the coating may be a Parylene coating. In some embodiments, the coating may have a porosity of between approximately 0.1% and 1.0%. In other embodiments, the coating may be a pinhole free coating (e.g., a porosity of approximately 0%). In some embodiments, the coating is an optically transparent coating. In some embodiments, coating 280 may be any conformal, optically transparent coating that has an index of refraction of between about 1.57 to 1.67 and is resistant to fluorine-, chlorine-, sulfur-, hydrogen-, bromine-, or nitrogen-based acids. The coating may be deposited using a non-line of sight deposition technique, such as Parylene deposition, ALD, CVD, or PECVD. The coating may be deposited onto the entire interior of the assembled device. The coating may have a uniform thickness of between about 0.1 microns to about 20 microns, or about 3 microns to about 6 microns, or about 4 microns to about 5 microns, or about 7 microns to about 15 microns, or about 15 microns to about 20 microns.

Referring now to a deposition process, at block 442 a vacuum may be applied to the deposition chamber. The vacuum may be applied at about 0.1 torr, and the vacuum can be applied for a time period in a range from about 5 minutes to about 180 minutes for a Parylene deposition process. The deposition chamber may be maintained at a temperature of about 25° C. for a Parylene deposition process.

During a pre-processing phase of a Parylene deposition process, a powdered Parylene dimer (e.g., a [2,2] paracyclophane dimer) may be provided as a precursor to the Parylene coating. The Parylene dimer may be vaporized into a dimeric Parylene gas. The powdered dimer may be vaporized at a temperature of between about 80° C. to about 150° C. and a pressure of about 1.0 torr in embodiments. The dimeric Parylene gas may then be pyrolized into a monomeric Parylene gas. During pyrolization, the dimer may be cleaved at two methylene-methylene bonds to yield monomeric Parylene gas. The pyrolization may occur at a temperature of between about 650° C. to about 680° C. and a pressure of about 0.5 torr.

At block 444, the precursor for the Parylene coating or rare earth oxide coating may be injected into the deposition chamber where the assembled device has been loaded. The precursor may be the monomeric Parylene gas produced during the pre-processing phase, or may be a rare earth precursor. The precursor may enter the interior of the assembled device through one or more openings of the assembled device that exposes the interior to the external environment.

At block 446, the conformal, inert (and optionally optically transparent) coating may be deposited on the surface of one or more internal components. In one embodiment, a monomeric Parylene gas present in the interior of the assembled device may adsorb and polymerize on all interior surfaces within the assembled device, coating all internal components, as well as all unmasked external components. In one embodiment, the rare earth precursor adsorbs onto the surface of interior components to form an adsorption layer thereon, and a remainder of the rare earth precursor is pumped out of the chamber. An oxygen containing reactant may then be flowed into the chamber to react with the adsorption layer and form a rare earth oxide coating.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An article comprising:
   an optical encoder comprising:
      a plurality of internal components enclosed within the optical encoder;
      a wall including one or more openings that expose the plurality of internal components to an exterior environment of the optical encoder during operation of the optical encoder;
      an optical window in the wall of the optical encoder, wherein the optical window is configured to transmit light between the exterior environment of the optical encoder and an interior environment of the optical encoder during the operation of the optical encoder, wherein one or more surfaces of the optical window in the wall of the optical window are covered by a mask during a coating process for the optical encoder; and a coating that is deposited, by the coating process, onto a surface of each of the plurality of internal components enclosed within the optical encoder and each exterior surface of the optical encoder that is not covered by the mask, wherein the coating is deposited onto the surface of each of the plurality of internal components via the one or more openings of the optical encoder and without altering a structure of the optical encoder and the wall, and wherein the coating is a conformal, optically transparent coating that is resistant to corrosion by at least one of fluorine-based acids, chlorine-based acids, sulfur-based acids, hydrogen-based acids, bromine-based acids, or nitrogen-based acids and that does not negatively impact a functionality of the plurality of internal components.

2. The article of claim 1, wherein the coating comprises a poly(p-xylylene) polymer coating.

3. The article of claim 2, wherein the coating comprises Parylene C.

4. The article of claim 1, wherein the plurality of internal components comprise one or more optical components.

5. The article of claim 4, wherein the one or more optical components comprise at least one of an optical lens or a laser head.

6. The article of claim 1, wherein the coating has an approximately uniform thickness of between about 0.1 microns to about 20 microns, and wherein the coating coats an entire interior of the optical encoder.

7. The article of claim 1, wherein the coating has a thickness of between about 4 microns to about 5 microns.

8. An article comprising an optical encoder comprising a plurality of internal components that are enclosed within an interior of the optical encoder, a wall including one or more openings that expose the plurality of internal components during operation of the optical encoder, an optical window in the wall of the optical encoder, wherein the optical window transmits light between an external environment of the optical encoder and an interior environment of the optical encoder during the operation of the optical encoder, and a coating that is deposited onto a surface of each of the plurality of internal components enclosed within the optical encoder without altering a structure of the optical encoder and the wall, wherein the coating is a conformal, optically transparent coating, the article having been manufactured by a process comprising:

loading the optical encoder into a deposition chamber, wherein the loaded optical encoder comprises a mask covering one or more surfaces of the optical window; and depositing the coating onto the surface of each of the plurality of internal components using a non-line-of-sight deposition process without altering the structure of the optical encoder or impacting functionality of the optical encoder, wherein depositing the coating onto the surface of the internal components comprises injecting a precursor for the coating into the deposition chamber, wherein the precursor penetrates an exterior of the optical encoder through the one or more openings of the optical encoder that expose the interior of the optical encoder to an external environment, and wherein the coating is deposited on each surface of the optical encoder that is not covered by the mask.

9. The article of claim 8, wherein depositing the coating onto the surface of the internal components comprises performing a chemical vapor deposition process of a poly(p-xylylene) polymer in a vacuum; and the coating comprises a poly(p-xylylene) polymer coating.

* * * * *